(12) United States Patent
Shin

(10) Patent No.: US 7,280,431 B2
(45) Date of Patent: Oct. 9, 2007

(54) METHOD OF GENERATING AN INTERNAL CLOCK FOR A SEMICONDUCTOR MEMORY DEVICE AND SEMICONDUCTOR MEMORY DEVICE USING THE SAME

(75) Inventor: Sang-Woong Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 6 days.

(21) Appl. No.: 11/388,720

(22) Filed: Mar. 24, 2006

(65) Prior Publication Data

US 2006/0239087 A1 Oct. 26, 2006

(30) Foreign Application Priority Data

Apr. 22, 2005 (KR) ...................... 10-2005-0033481

(51) Int. Cl.
*G11C 8/00* (2006.01)
(52) U.S. Cl. .................. 365/233; 365/194; 365/230.08
(58) Field of Classification Search ................ 365/233, 365/194, 230.08
See application file for complete search history.

(56) References Cited

U.S. PATENT DOCUMENTS 5,675,274 A 10/1997 Kobayashi et al. ......... 327/158

6,301,190 B1 * 10/2001 Tsujino et al. .............. 365/233

FOREIGN PATENT DOCUMENTS

| JP | 08-167890 | 6/1996 |
| KR | 10-2003-0071094 | 9/2003 |
| KR | 10-2004-0078473 | 9/2004 |

* cited by examiner

*Primary Examiner*—Huan Hoang
(74) *Attorney, Agent, or Firm*—Mills & Onello LLP

(57) ABSTRACT

In a method of generating an internal clock for a semiconductor memory device, a doubled clock is generated during operation in a high-speed test mode in response to an external clock. A data clock is generated by delaying the doubled clock so that data read from a memory cell array in the semiconductor memory device is output in synchronization with the external clock. A doubled sync clock synchronized with the external clock is generated by delaying the data clock. An internal clock is generated during operation in the high-speed test mode by delaying the doubled sync clock by a delay amount that corresponds to a delay amount experienced in generation of an internal clock in response to the external clock during operation in a normal mode. Accordingly, the high-speed test operation of the semiconductor memory device can be efficiently performed.

14 Claims, 9 Drawing Sheets

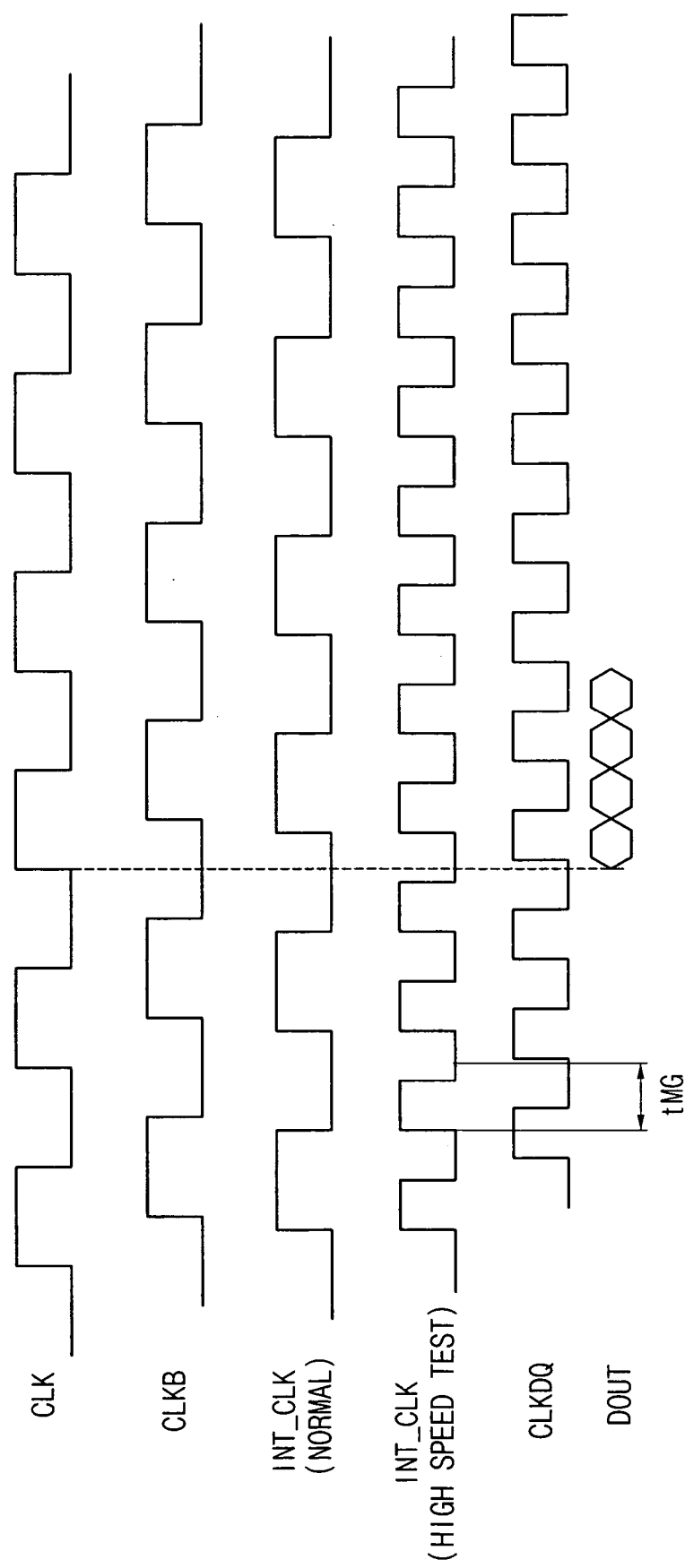

METHOD OF GENERATING AN INTERNAL CLOCK FOR A SEMICONDUCTOR MEMORY DEVICE AND SEMICONDUCTOR MEMORY DEVICE USING THE SAME

PRIORITY STATEMENT

This application claims benefit of priority under 35 USC § 119 to Korean Patent Application No. 2005-33481 filed on Apr. 22, 2005, the contents of which are herein incorporated by reference in its entirety.

BACKGROUND OF THE INVENTION

1. Field of the Invention

The present invention relates to a semiconductor memory device, and more particularly to a semiconductor memory device that operates in a high-speed test mode at a higher frequency than an external clock frequency and further relates to a method for generating an internal clock for a semiconductor memory device.

2. Description of the Related Art

As the operating speed of semiconductor memory devices continues to increase, there is an increased likelihood that the operation speed of a tester for testing the semiconductor memory device will unfortunately fail to keep up with the operating speed of the semiconductor memory device.

For example, while the semiconductor memory device can operate at a frequency of about 400 MHz, a tester may not be able to generate signals greater than about 200 MHz. In this case, when the tester is used to test the semiconductor memory device at a frequency of 200 MHz, more time is required to complete the test. Particularly, when the semiconductor memory device operates at a high speed, the test cannot be properly performed by the tester having such a low operating speed.

There may be instances where a high-speed semiconductor memory device, such as a dynamic random access memory (DRAM), is to undergo testing using a low-speed tester with a low operating speed, that is, where a high-speed test mode needs to be performed using the low-speed tester. In this case, an internal clock of a frequency higher than that of an external clock applied from the low-speed tester may be generated in the high-speed semiconductor memory device so as to make it possible to test the high-speed operation of the high-speed semiconductor memory device using the low-speed tester. For example, a doubled clock having a doubled frequency with respect to the external clock frequency may be generated by performing an XOR operation of the external clock and a 90°-delayed external clock, thereby making it possible to test the high-speed semiconductor memory device at high speed.

FIG. 1 is a block diagram of a conventional semiconductor memory device.

Referring to FIG. 1, the conventional semiconductor memory device includes a delay-locked loop (DLL) circuit 110, a clock buffer 120, and an internal circuit 130.

In a normal mode operation, the DLL circuit 110 generates, by causing an external clock CLK to pass through a DLL, a data clock for outputting data DATA read from a memory cell array to an external device. In the normal mode of operation, the data clock is generated so that the data can be output in synchronization with the external clock CLK. In a high-speed test mode, the DLL circuit 110 generates a doubled clock with a frequency higher than that of the external clock CLK by using the external clock CLK and a 90°-delayed external clock CLKB, and generates the data clock for outputting the read data DATA from the memory cell array to the external device by causing the external clock CLK to pass through the DLL.

In the normal mode operation, the clock buffer 120 buffers the external clock to generate an internal clock INT_CLK. In the high-speed test mode, the clock buffer 120 performs an XOR operation of the external clock CLK and the 90°-delayed external clock CLKB to generate the internal clock INT_CLK having a frequency that is double that of the external clock CLK.

The internal circuit 130 includes a test mode circuit 131 and a peripheral circuit 132. The internal circuit 130 performs a read/write operation of the semiconductor memory device in response to the internal clock INT_CLK.

The test mode circuit 131 controls various test mode settings of the semiconductor memory device. The test mode circuit 131 includes a test mode register, and outputs a test mode signal TEST_MRS according to a test mode set by a test mode command received from an external source.

The peripheral circuit 132 denotes all circuits of the internal circuit 130 except the circuits related to the test mode setting. For example, the peripheral circuit 132 includes a memory cell array, a row decoder, a column decoder, and a sense amplifier. The peripheral circuit 132 operates according to the test mode signal TEST_MRS received from the test mode circuit 131. For example, in one test, the peripheral circuit 132 reads data from the memory cell array and outputs the read data.

As illustrated in FIG. 1, when the same internal clock INT_CLK is input into the test mode circuit 131 and the peripheral circuit 132, a clock of a frequency higher than that of the external clock CLK is also applied to the test mode circuit 131 in the high-speed test mode. Since the test mode circuit 131 needs to process various test commands according to the external clock CLK, it may not properly process a test command from an external source when a high-speed clock is internally applied in the high-speed test mode.

FIG. 2 is a block diagram of the DLL circuit 110 illustrated in FIG. 1.

Referring to FIG. 2, the DLL circuit 110 includes a clock doubler 210, a buffer 220, a selector 230, a DLL 240, a buffer 250, and an output driver 260.

The clock doubler 210 generates a doubled clock 2×CLK with double the frequency of the external clock CLK by using the external clock CLK and the 90°-delayed external clock CLKB. As illustrated in FIG. 2, the clock doubler 210 may be an XOR gate.

The buffer 220 buffers the external clock CLK.

The selector 230 selects an output signal of the buffer 220 or an output signal of the clock doubler 210 in response to a high-speed test mode signal HSC. That is, the selector 230 outputs the external clock from the buffer 220 in the normal mode, and outputs the doubled clock 2×CLK from the clock doubler 210 in the high-speed test mode. The selector 230 may be implemented using a multiplexer (MUX).

The DLL 240 includes a variable delay line (VDL) 241, a delay compensator 242, a phase detector (PD) 243, and a low-pass filter (LPF) 244.

The VDL 241 delays an output signal of the selector 230. An output signal of the VDL 241 is output through the buffer 250 as a data clock CLKDQ.

The delay compensator 242 compensates the output signal of the VDL 241 for a delay of the VDL 241. For example, the delay compensator 242 delays the output signal of the VDL 241 to compensate for the delay of the VDL 241.

The PD 243 detects a phase difference between the output signal of the selector 230 and an output signal of the delay compensator 242.

The LPF 244 low-pass filters an output signal of the PD 243 to output a signal for adjusting the delay of the VDL 241.

The output driver 260 outputs the read data DATA from the memory cell to an external device according to the data clock CLKDQ. Generally, in the normal mode operation, the output driver 260 drives the read data DATA to be output in synchronization with the external clock CLK.

FIG. 3 is a block diagram of the clock buffer 120 illustrated in FIG. 1.

Referring to FIG. 3, the clock buffer 120 includes a clock doubler 310, a buffer 320, and a selector 330.

The clock doubler 310 generates a doubled clock having a frequency that is double the frequency of the external clock CLK by using the external clock CLK and the 90°-delayed external clock CLKB.

The buffer 320 buffers the external clock CLK.

The selector 330 selects an output signal of the buffer 320 or an output signal of the clock doubler 310 in response to a state of a high-speed test mode signal HSC. That is, the selector 330 outputs the external clock from the buffer 320 as the internal clock INT_CLK when operating in the normal mode, and outputs the doubled clock from the clock doubler 310 as the internal clock INT_CLK when operating in the high-speed test mode.

FIG. 4 is a timing diagram illustrating a problem associated with the conventional internal clock generation method.

Referring to FIG. 4, the internal clock INT_CLK in the normal mode is generated by buffering the external clock CLK, and the internal clock INT_CLK in the high-speed test mode is generated by performing an XOR operation of the external clock CLK and the 90°-delayed external clock CLKB. When compared to the internal clock INT_CLK in the normal mode, the internal clock INT_CLK in the high-speed test mode has an XOR delay, that is, a delay due to the XOR operation.

The XOR delay is commonly generated at the DLL circuit 110 and the clock buffer 120. Particularly, the XOR delay of the DLL 240 causes a delay of the data clock CLKDQ illustrated in FIG. 4. The delay of the data clock CLKDQ in turn causes the output data DOUT of the output driver 260 to be more delayed than the external clock CLK by a delay time tDQSCK.

Furthermore, a process variation (PVT variation) corresponding to the XOR delay is generated to reduce a valid data window tDV of the output data DOUT. This XOR delay causes a difference between the operating characteristics of the semiconductor memory device in the normal mode and in the high-speed test mode, thereby preventing a proper test operation on the semiconductor memory device.

In order to solve the problem due to the above XOR delay, the delay compensator 242 compensates for the XOR delay as well as the delay of the VDL 241. When the delay compensator 242 also compensates for the XOR delay, the data clock CLKDQ can be generated such that the output data DOUT from the semiconductor memory device is synchronized with the external clock CLK. However, the margin between the internal clock INT_CLK and the data clock CLKDQ in the high-speed test mode is undesirably reduced, thereby reducing the frequency margin of the semiconductor memory device.

SUMMARY OF THE INVENTION

Accordingly, the present invention is provided to substantially obviate one or more problems associated with the limitations and disadvantages of the related art. In particular, the present invention provides a semiconductor memory device that can be efficiently tested while its operating characteristic in the high-speed test mode is maintained similar to that in the normal mode, and an associated method for testing such a semiconductor memory device.

Embodiments of the present invention provide a method for generating an internal clock for a semiconductor memory device so as to efficiently perform a high-speed test on the semiconductor memory device.

Embodiments of the present invention provide a semiconductor memory device that may be efficiently tested in a high-speed test mode.

In one aspect, the present invention is directed to a method of generating an internal clock for a semiconductor memory device, the method comprising: generating a doubled clock during operation in a high-speed test mode in response to an external clock; generating a data clock by delaying the doubled clock so that data read from a memory cell array in the semiconductor memory device is output in synchronization with the external clock; generating a doubled sync clock synchronized with the external clock by delaying the data clock; and generating an internal clock during operation in the high-speed test mode by delaying the doubled sync clock by a delay amount that corresponds to a delay amount experienced in generation of an internal clock in response to the external clock during operation in a normal mode.

In one embodiment, generating the data clock includes compensating for a delay occurring during the generation of the doubled clock at a delay-locked loop so that the data clock causes the read data to be output in synchronization with the external clock.

In another embodiment, the delay-locked loop adjusts a delay of a variable delay line in response to a phase difference between the doubled clock and the doubled sync clock, the variable delay line being included in the delay-locked loop.

In another embodiment, the doubled clock is generated by performing an XOR operation of the external clock and a 90°-delayed external clock.

In another aspect, the present invention is directed to a semiconductor memory device comprising: a clock doubler configured to generate a doubled clock during operation in a high-speed test mode in response to an external clock; a delay-locked loop configured to generate a data clock in response to the doubled clock so that data read from a memory cell array in the semiconductor memory device is output in synchronization with the external clock, and configured to generate a doubled sync clock synchronized with external clock by delaying the data clock; a clock buffer configured to generate an internal clock during operation in the high-speed test mode by delaying the doubled sync clock by a delay amount that corresponds to a delay amount experienced in generation of an internal clock in response to the external clock during operation in a normal mode; and an internal circuit configured to read the data from the memory cell array in response to the internal clock.

In one embodiment, the clock doubler comprises an XOR gate.

In another embodiment, the delay-locked loop includes: a variable delay line configured to delay the doubled clock in response to a delay control signal; a delay compensator configured to compensate an output signal of the variable delay line for a delay time of the variable delay line; a doubling compensator configured to compensate an output signal of the delay compensator for a delay time of the clock doubler; a phase detector configured to detect a phase difference between the doubled clock and an output signal of the doubling compensator; and a low-pass filter configured to filter an output signal of the phase detector to generate the delay control signal.

In another embodiment, the data clock is generated by buffering the output signal of the variable delay line.

In another embodiment, the clock buffer generates a test control clock having substantially the same frequency as the external clock during operation in the high-speed test mode.

In another embodiment, the internal circuit includes: a peripheral circuit configured to read the data from the memory cell array and output the read data in response to the internal clock; and a test mode circuit configured to control a test mode of the peripheral circuit by generating a test mode signal in response to an external test command and the test control clock.

In another aspect, the present invention is directed to a semiconductor memory device comprising: a clock doubler configured to generate a doubled clock during operation in a high-speed test mode by using an external clock; a delay-locked loop configured to generate a data clock for outputting data that is read from a memory cell array in response to the doubled clock; a clock buffer configured to generate an internal clock having double the frequency of the external clock and a test control clock having substantially the same frequency as the external clock during operation in the high-speed test mode; and an internal circuit configured to control a test mode of the semiconductor memory device in response to the test control clock, and configured to output the data that is read from the memory cell array in response to the internal clock.

In one embodiment, the clock doubler comprises an XOR gate.

In another embodiment, the delay-locked loop includes: a variable delay line configured to delay the doubled clock in response to a delay control signal; a delay compensator configured to compensate an output signal of the variable delay line for a delay time of the variable delay line; a doubling compensator configured to compensate an output signal of the delay compensator for a delay time of the XOR gate; a phase detector configured to detect a phase difference between the doubled clock and an output signal of the doubling compensator; and a low-pass filter configured to filter an output signal of the phase detector to generate the delay control signal.

In another embodiment, the data clock is generated by buffering the output signal of the variable delay line.

Accordingly, it is possible to efficiently perform a high-speed test operation on the semiconductor memory device.

BRIEF DESCRIPTION OF THE DRAWINGS

The above and other advantages of the present invention will become more apparent by describing in detail the example embodiments thereof with reference to the accompanying drawings, in which:

FIG. 10 is a timing diagram illustrating a method for generating an internal clock for a semiconductor memory device according to an example embodiment of the present invention.

DESCRIPTION OF EMBODIMENTS OF THE INVENTION

Hereinafter, the example embodiments of the present invention will be described in detail with reference to the accompanying drawings.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
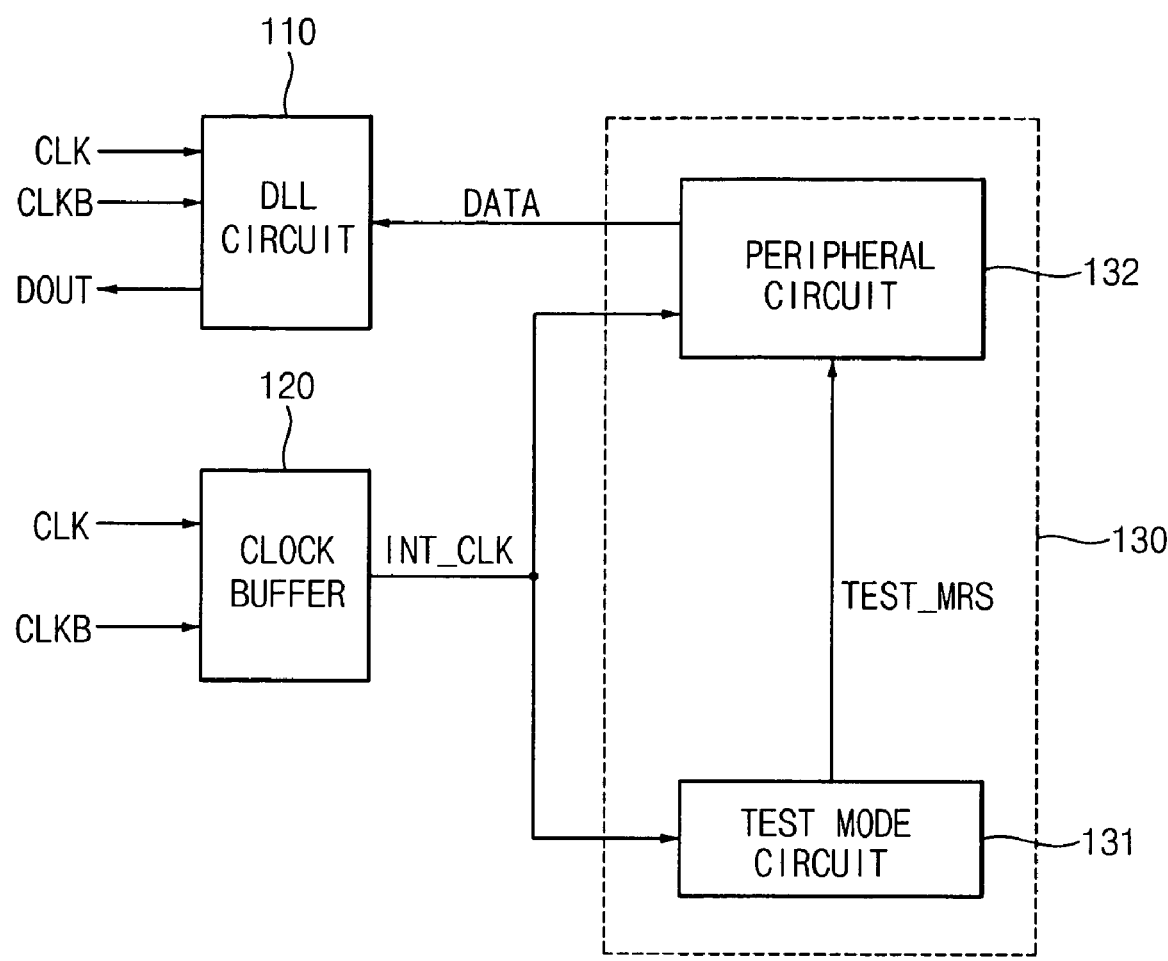
FIG. 1 is a block diagram of a conventional semiconductor memory device.
Figure 2:
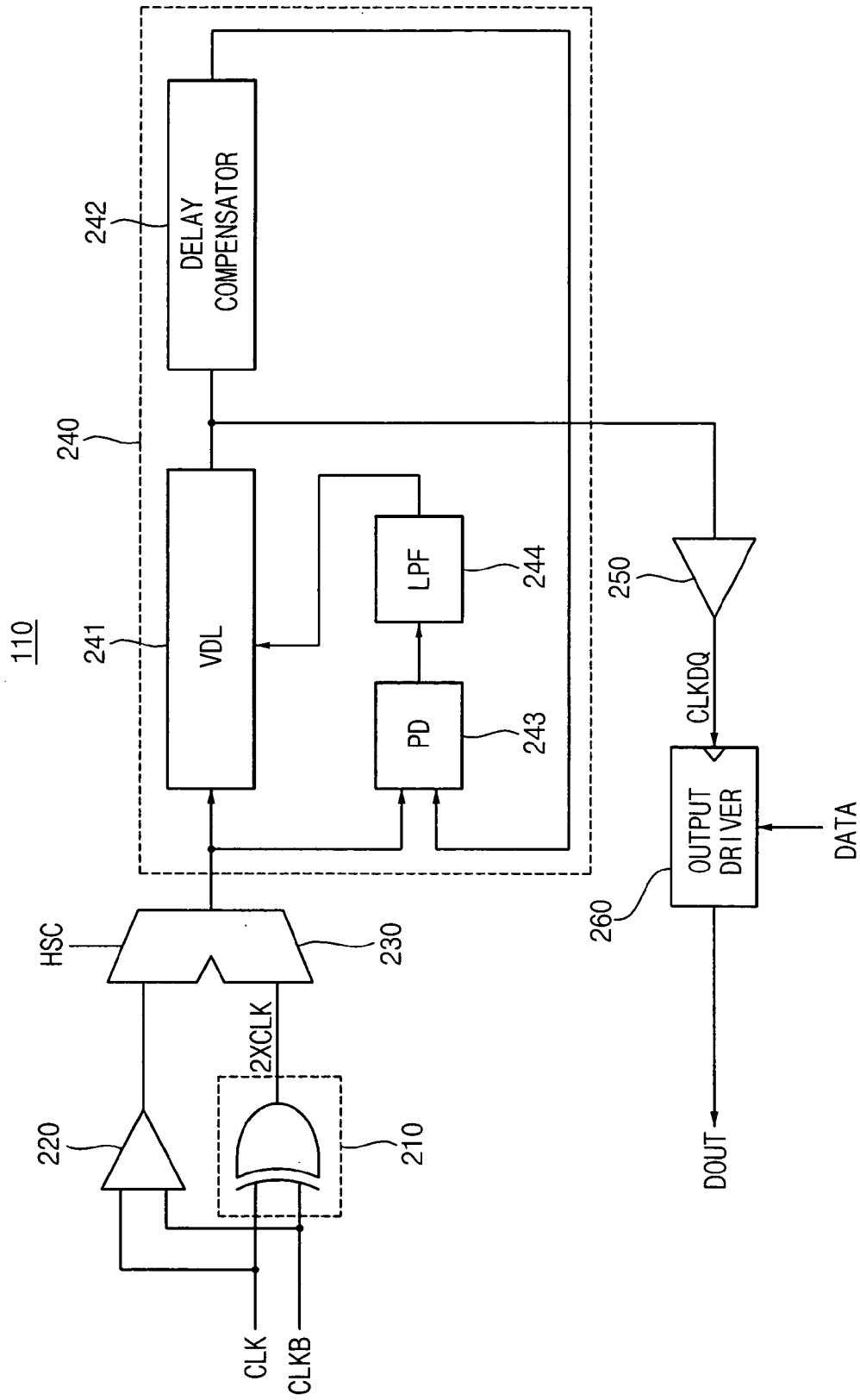
FIG. 2 is a block diagram of a delay-locked loop (DLL) circuit illustrated in FIG. 1.
Figure 3:
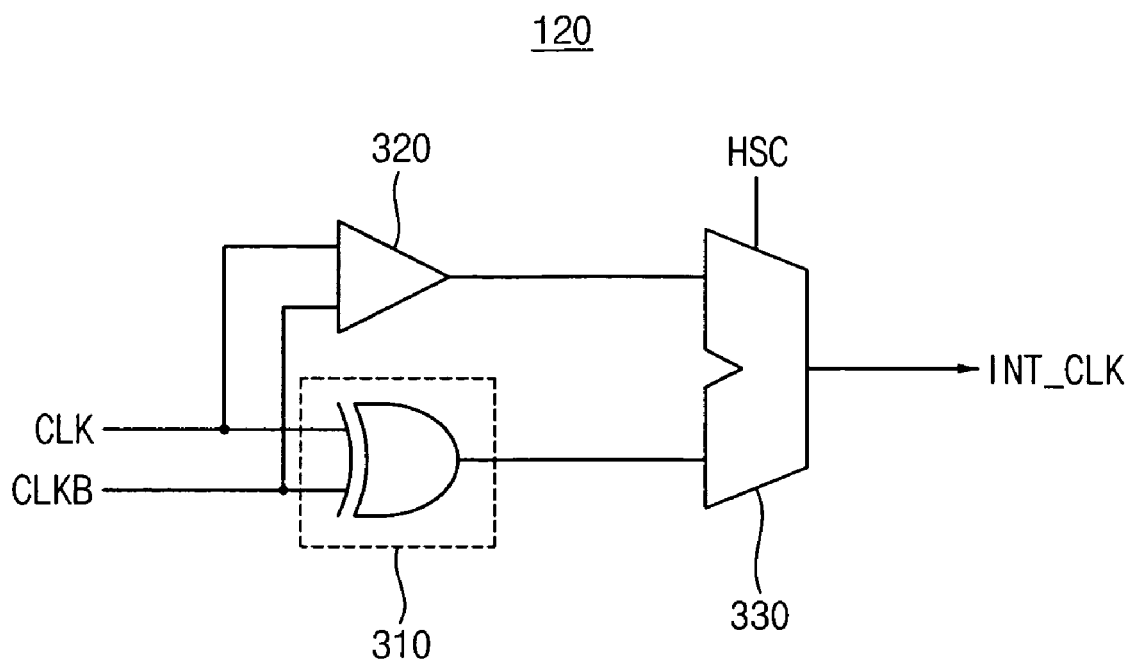
FIG. 3 is a block diagram of a clock buffer illustrated in FIG. 1.
Figure 4:
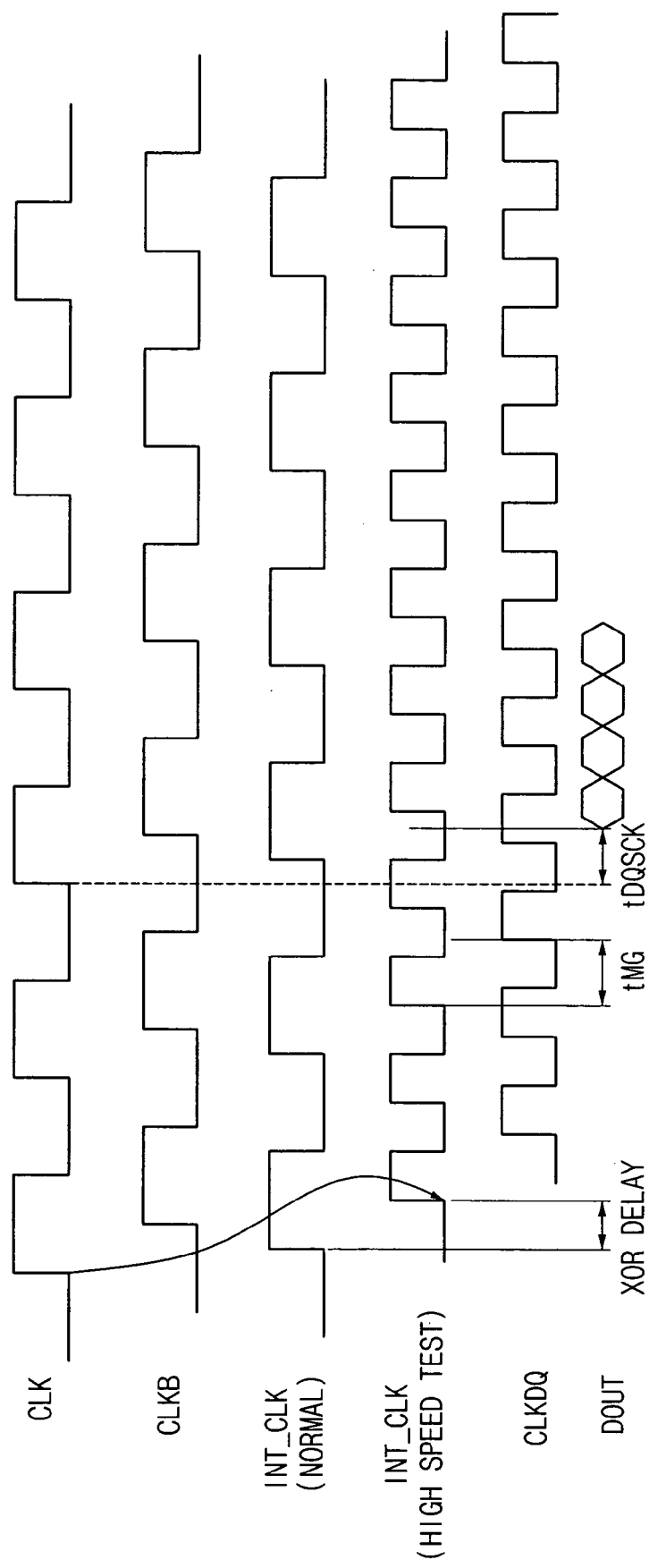
FIG. 4 is a timing diagram illustrating a problem associated with a conventional internal clock generation method.
Figure 5:
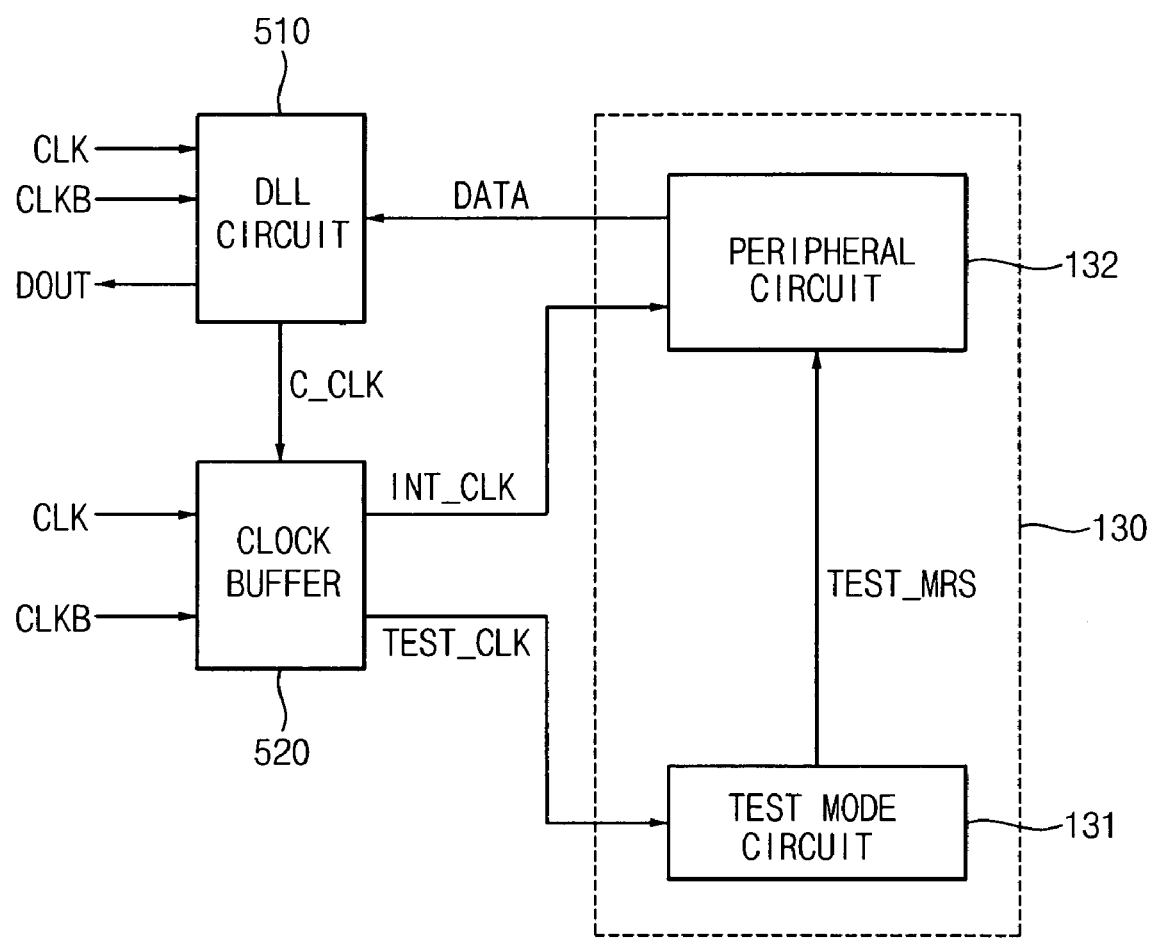
FIG. 5 is a block diagram of a semiconductor memory device according to an example embodiment of the present invention.

FIG. 5 is a block diagram of a semiconductor memory device according to an example embodiment of the present invention.

Referring to FIG. 5, the semiconductor memory device includes a delay-locked loop (DLL) circuit 510, a clock buffer 520, and an internal circuit 130.

In a normal mode, the DLL circuit 510 generates, by using an external clock CLK, a data clock for outputting data DATA read from a memory cell array to an external device. In a test mode, the DLL circuit 510 generates, by using the external clock CLK and a 90°-delayed external clock CLKB, a data clock for outputting data DATA read from a memory cell array to an external device and a doubled sync clock C_CLK synchronized with the external clock CLK. In a high-speed test mode, the data clock and the doubled sync clock have a higher frequency than the external clock CLK. The DLL circuit 510 generates the data clock so that the read data DATA may be output in synchronization with the external clock CLK in the high-speed test mode as well as the normal mode. In the high-speed test mode, the DLL circuit 510 may generate a doubled clock with a higher frequency than the external clock by using the external clock CLK and the 90°-delayed external clock CLKB, can generate the data clock by using the doubled clock so that the read data DATA may be output in synchronization with the external clock CLK, and can generate the doubled sync clock C_CLK synchronized with the external clock CLK.

For example, the DLL circuit 510 performs an XOR operation of the external clock CLK and the 90°-delayed external clock CLKB to generate the doubled clock with double the frequency of the external clock CLK. The data clock is used to output the read data DATA to the external device.

In the normal mode, the clock buffer 520 buffers the external clock to generate an internal clock INT_CLK. In the high-speed test mode, the clock buffer 520 delays the doubled sync clock C_CLK by the delay of the clock buffer in the normal mode to generate the internal clock INT_CLK. The doubled sync clock C-CLK has a higher frequency than the external clock CLK and is synchronized with the external clock CLK. For example, the doubled sync clock C_CLK has double the frequency of the external clock CLK, and has a rising edge at a time when the external clock has a rising edge. Accordingly, when the doubled sync clock C_CLK is delayed by the delay of the clock buffer in the normal mode to generate the internal clock INT_CLK, it is possible to enhance the correlation between the normal mode and the high-speed test mode of the semiconductor memory device.

The clock buffer 520 also generates a test control clock TEST_CLK with the same frequency as the external clock CLK.

The internal circuit 130 includes a test mode circuit 131 and a peripheral circuit 132. The internal circuit 130 performs a read/write operation of the semiconductor memory device. For example, the internal circuit 130 reads data from the memory cell array and outputs the read data.

The test mode circuit 131 controls various test mode settings of the semiconductor memory device. The test mode circuit 131 includes a test mode register, and may output a test mode signal TEST_MRS in accordance with the test mode set by a test mode command received from an external source. The test mode circuit 131 receives the test control clock TEST_CLK with the same frequency as the external clock CLK and operates according to the same.

The peripheral circuit 132 denotes all circuits of the internal circuit 130 except those circuits related to the test mode setting. For example, the peripheral circuit 132 includes a memory cell array, a row decoder, a column decoder, and a sense amplifier. The peripheral circuit 132 may operate according to the test mode signal TEST_MRS received from the test mode circuit 131.

In the example embodiment illustrated in FIG. 5, the peripheral circuit 132 operates according to the internal clock INT_CLK, and the test mode circuit 131 operates according to the test control clock TEST_CLK. In this manner, when the test mode circuit 131 operates according to the test control clock TEST_CLK instead of the internal clock INT_CLK, the operating frequency of the test mode circuit 131 becomes identical to the frequency of the external clock CLK, and thus a test command input from the external source may be properly processed even in the case of a high-speed test mode where the internal clock INT_CLK has a higher frequency than the external clock CLK.

Figure 6:
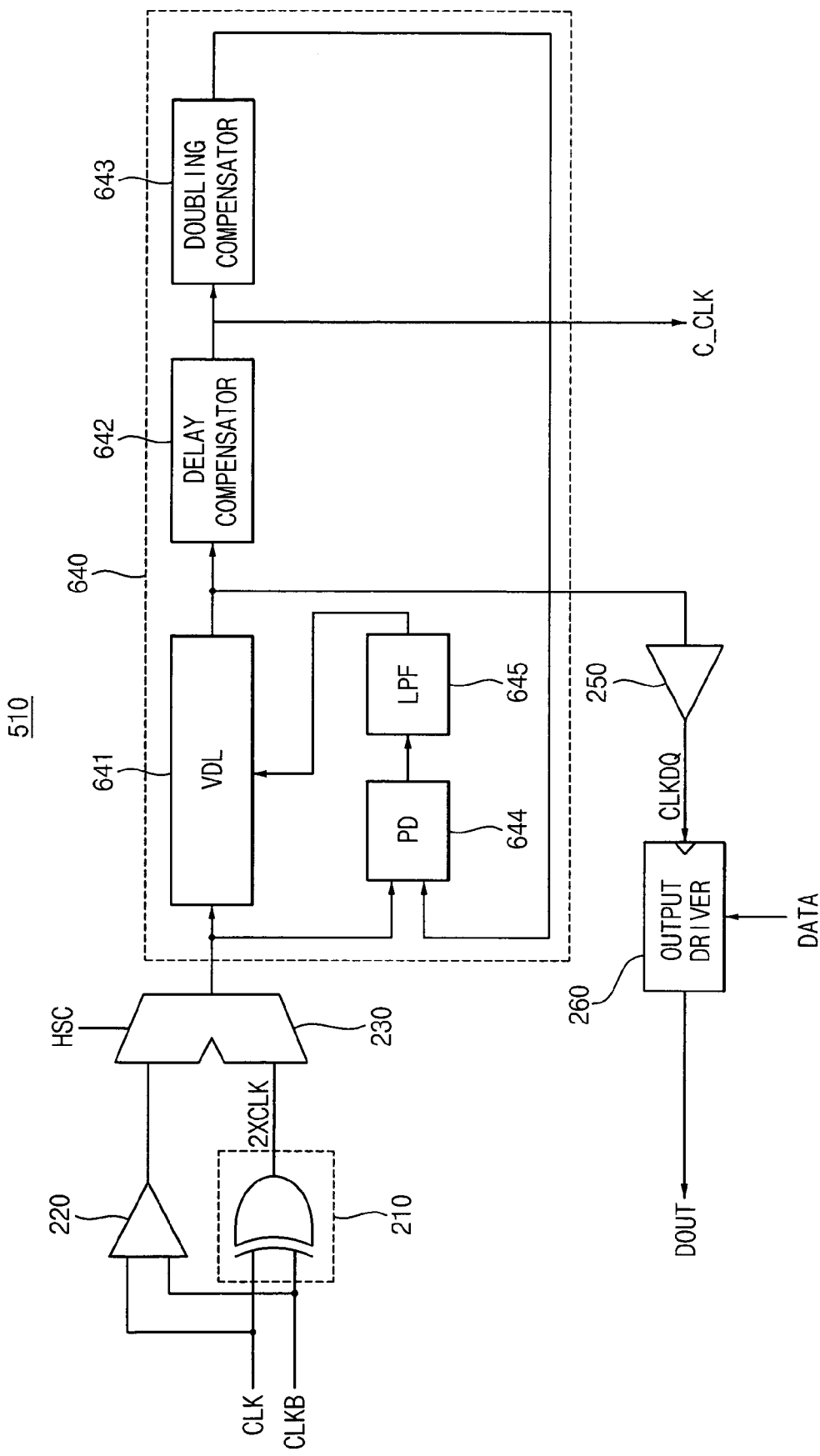
FIG. 6 is a block diagram of a DLL circuit illustrated in FIG. 5.

FIG. 6 is a block diagram of the DLL circuit 510 illustrated in FIG. 5.

Referring to FIG. 6, the DLL circuit 510 includes a clock doubler 210, a buffer 220, a selector 230, a DLL 640, a buffer 250, and an output driver 260.

The clock doubler 210 generates a doubled clock 2×CLK having a frequency that is double that of the external clock CLK by using the external clock CLK and the 90°-delayed external clock CLKB. As illustrated in FIG. 6, the clock doubler 210 may be an XOR gate.

The buffer 220 buffers the external clock CLK.

The selector 230 selects an output signal of the buffer 220 or an output signal of the clock doubler 210 according to a high-speed test mode signal HSC. That is, the selector 230 outputs the external clock from the buffer 220 in the normal mode, and outputs the doubled clock 2×CLK from the clock doubler 210 in the high-speed test mode. The selector 230 may be implemented using a multiplexer (MUX) or a transmission gate.

The DLL 640 includes a variable delay line (VDL) 641, a delay compensator 642, a doubling compensator 643, a phase detector (PD) 644, and a low-pass filter (LPF) 645.

The VDL 641 delays an output signal of the selector 230. An output signal of the VDL 641 is output through the buffer 250 as a data clock CLKDQ.

The delay compensator 642 compensates the output signal of the VDL 641 for a delay time of the VDL 641. For example, the delay compensator 642 delays the output signal of the VDL 641 to compensate for the delay of the VDL 641.

The doubling compensator 643 compensates an output signal of the delay compensator 642 for a delay of the clock doubler 210. For example, when the clock doubler 210 is an XOR gate, the doubling compensator 643 delays the output signal of the delay compensator 642 to compensate for the delay of the XOR gate.

By adjustment of the delays at the delay compensator 642 and the doubling compensator 643, the data clock CLKDQ is generated such that the output of the VDL 641 is output through the buffer 250 to an external device in synchronization with the read data DATA from the memory cell array. Also, the delay of the delay compensator 642 and the doubling compensator 643 can be adjusted to make the output of the delay compensator 642 become the doubled sync clock C_CLK that is synchronized with the external clock.

The PD 644 detects a phase difference between the output signal of the selector 230 and the output signal of the doubling compensator 644.

The LPF 645 low-pass filters an output signal of the PD 644 to output a signal for adjusting the delay of the VDL 641.

The output driver 260 outputs the read data DATA from the memory cell to an external device according to the data clock CLKDQ. In this example embodiment, the output driver 260 drives the read data DATA to be output in synchronization with the external clock CLK in the high-speed test mode as well as in the normal mode.

Figure 7:
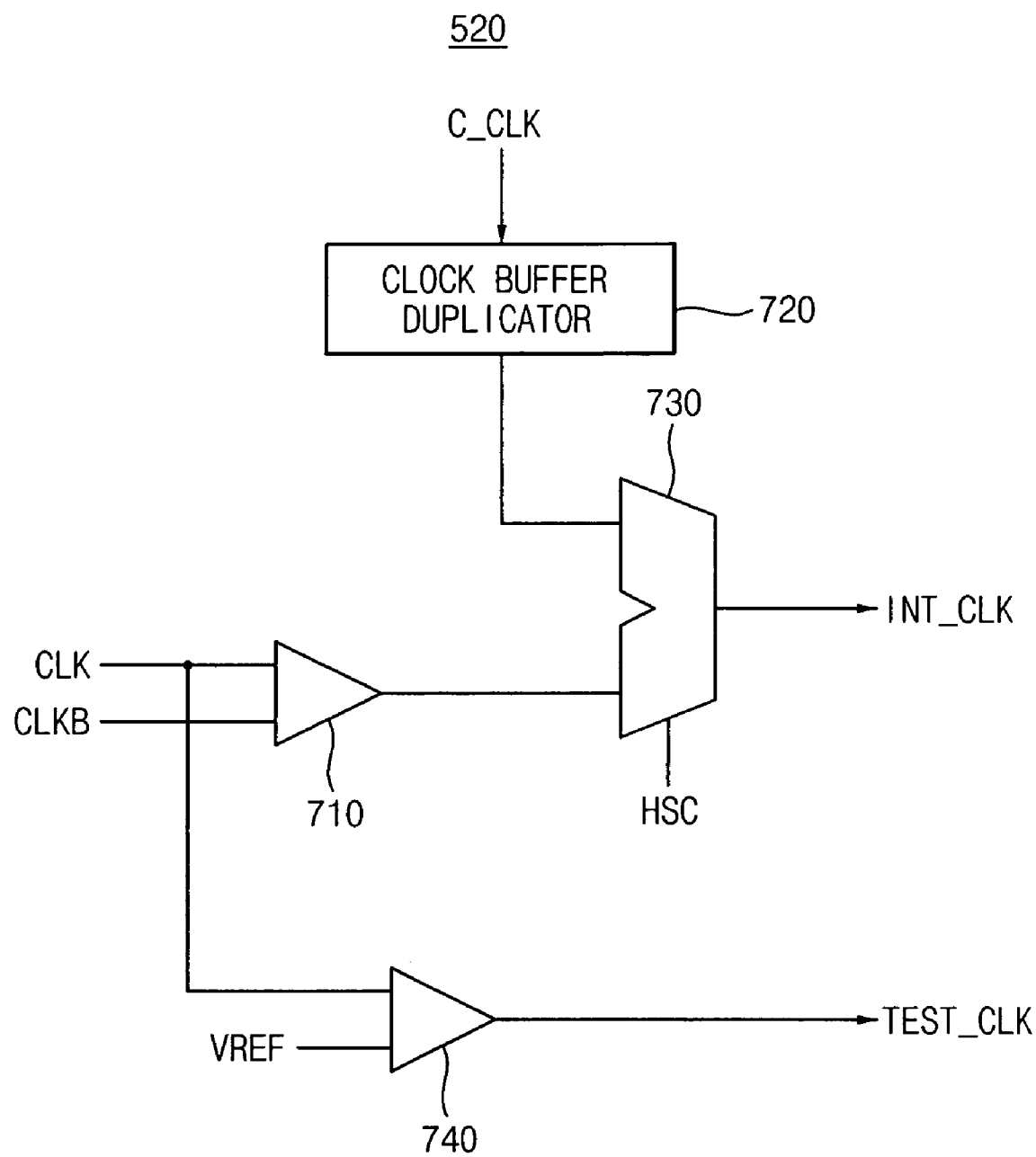
FIG. 7 is a block diagram of a clock buffer illustrated in FIG. 5.

FIG. 7 is a block diagram of the clock buffer 520 illustrated in FIG. 5.

Referring to FIG. 7, the clock buffer 520 includes a buffer 710, a clock buffer duplicator 720, a selector 730, and a buffer 740.

The buffer 710 buffers the external clock CLK.

The clock buffer duplicator 720 delays the doubled sync clock C_CLK by the delay of the clock buffer in the normal mode. The clock buffer duplicator 720 may be implemented using a delay circuit that is well known in the art.

The selector 730 selects an output signal of the buffer 710 or an output signal of the clock buffer duplicator 720 according to a high-speed test mode signal HSC. That is, the selector 730 outputs the external clock from the buffer 710 as the internal clock INT_CLK in the normal mode, and outputs the doubled sync clock C_CLK delayed by the clock buffer duplicator 720 as the internal clock INT_CLK in the high-speed test mode.

The buffer 740 buffers the external clock CLK on the basis of a reference signal VREF to generate a test control clock TEST_CLK. At this time, the buffer 740 may have substantially the same delay as the buffer 710.

Figure 8:
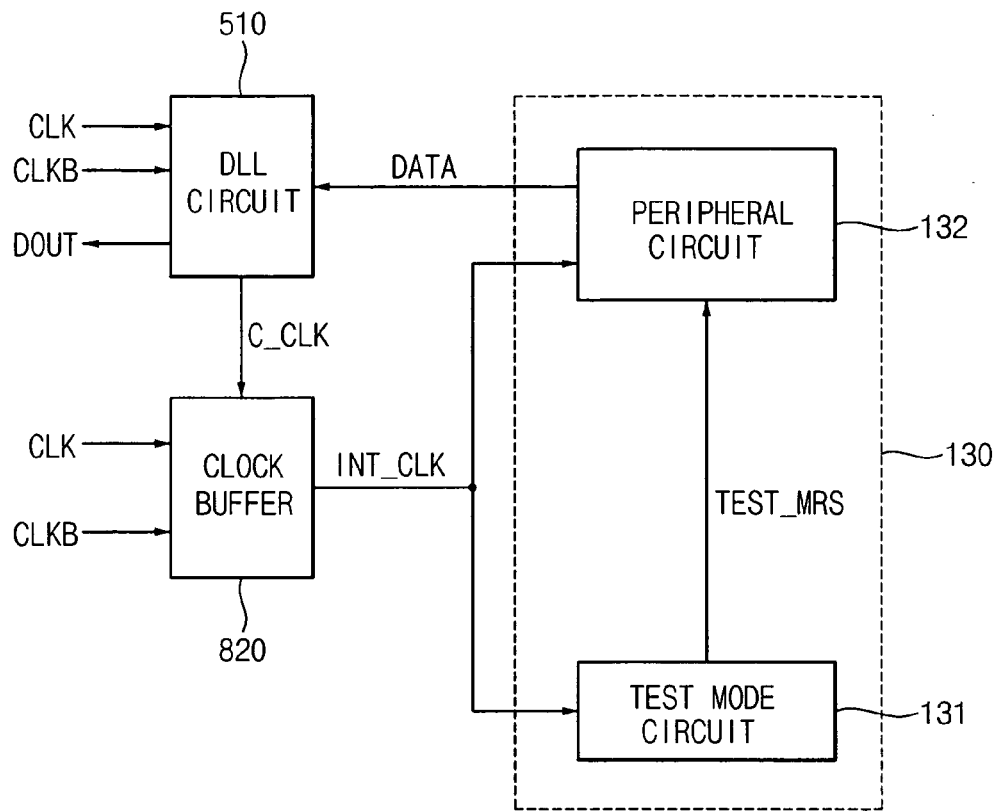
FIG. 8 is a block diagram of a semiconductor memory device according to another example embodiment of the present invention.

FIG. 8 is a block diagram of a semiconductor memory device according to another example embodiment of the present invention.

Referring to FIG. 8, the semiconductor memory device includes a delay-locked loop (DLL) circuit 510, a clock buffer 820, and an internal circuit 130.

In a normal mode, the DLL circuit 510 generates, by using an external clock CLK, a data clock for outputting data DATA read from a memory cell array to an external device. In a test mode, the DLL circuit 510 generates, by using the external clock CLK and a 90°-delayed external clock CLKB, a data clock for outputting data DATA read from a memory cell array to the external device and a doubled sync clock C_CLK synchronized with the external clock CLK. The DLL circuit 510 generates the data clock so that the read data DATA may be output in synchronization with the external clock CLK in the high-speed test mode as well as the normal mode. In the high-speed test mode, the DLL circuit 510 may generate a doubled clock with a higher frequency than the external clock by using the external clock CLK and the 90°-delayed external clock CLKB, generate the data clock by using the doubled clock so that the read data DATA may be output in synchronization with the external clock CLK, and generate the doubled sync clock C_CLK synchronized with the external clock CLK.

For example, the DLL circuit 510 performing an XOR operation of the external clock CLK and the 90°-delayed external clock CLKB to generate the doubled clock with double the frequency of the external clock CLK. The data clock is used to output the read data DATA to an external device.

In the normal mode, the clock buffer 520 buffers the external clock to generate an internal clock INT_CLK. In the high-speed test mode, the clock buffer 520 delays the doubled sync clock C_CLK by the delay of the clock buffer in the normal mode to generate the internal clock INT_CLK.

The doubled sync clock C-CLK has a higher frequency than the external clock CLK and is synchronized with the external clock CLK. For example, the doubled sync clock C_CLK has double the frequency of the external clock CLK, and has a rising edge at the time when the external clock has a rising edge. Accordingly, when the doubled sync clock C_CLK is delayed by the delay of the clock buffer in the normal mode to generate the internal clock INT_CLK, it is possible to enhance the correlation between the normal mode and the high-speed test mode of the semiconductor memory device.

The internal circuit 130 includes a test mode circuit 131 and a peripheral circuit 132. The internal circuit 130 performs a read/write operation of the semiconductor memory device. For example, the internal circuit 130 reads data from the memory cell array and outputs the read data.

The test mode circuit 131 controls various test mode settings of the semiconductor memory device. The test mode circuit 131 includes a test mode register, and may output a test mode signal TEST_MRS in response to a test mode set by a test mode command received from the external device. In this example embodiment, the test mode circuit 131 receives the internal clock INT_CLK and operates in synchronization with internal clock INT_CLK.

The peripheral circuit 132 denotes all circuits of the internal circuit 130 except for the circuit related to the test mode setting. For example, the peripheral circuit 132 includes a memory cell array, a row decoder, a column decoder, and a sense amplifier. The peripheral circuit 132 operates in response to the test mode signal TEST_MRS received from the test mode circuit 131.

Both the test mode circuit 131 and the peripheral circuit 132 shown in FIG. 5 may operate in synchronization with the internal clock INT_CLK so as to readily implement the semiconductor memory device.

Figure 9:
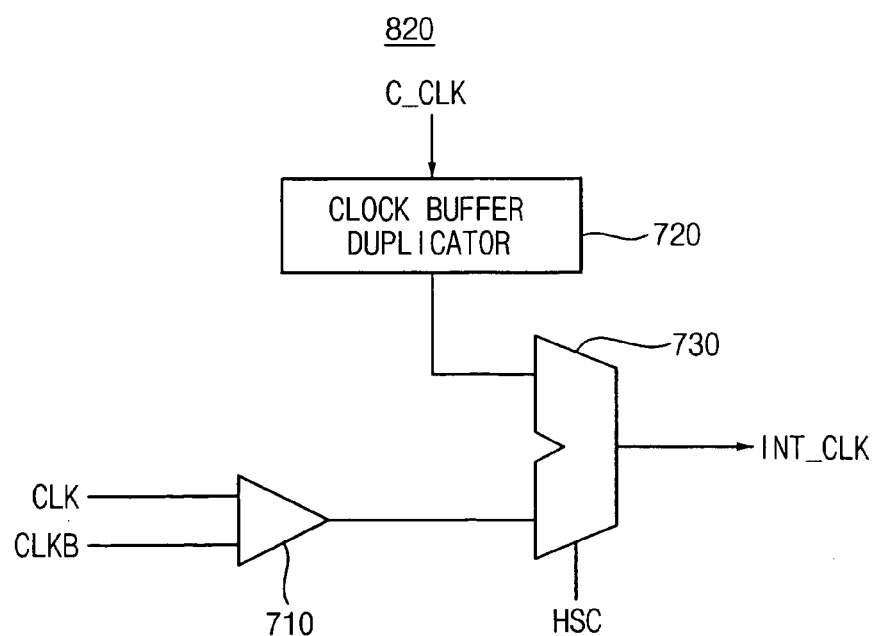
FIG. 9 is a block diagram of a clock buffer illustrated in FIG. 8.

FIG. 9 is a block diagram of the clock buffer 820 illustrated in FIG. 8.

Referring to FIG. 9, the clock buffer 820 includes a buffer 710, a clock buffer duplicator 720 and a selector 730.

The buffer 710 buffers the external clock CLK.

The clock buffer duplicator 720 delays the doubled sync clock C_CLK by the delay of the clock buffer in the normal mode. The clock buffer duplicator 720 may be implemented using a delay circuit that is well known in the art.

The selector 730 selects an output signal of the buffer 710 or an output signal of the clock buffer duplicator 720 according to a high-speed test mode signal HSC. That is, the selector 730 outputs the external clock from the buffer 710 as the internal clock INT_CLK when operating in the normal mode, and outputs the doubled sync clock C_CLK delayed by the clock buffer duplicator 720 as the internal clock INT_CLK when operating in the high-speed test mode.

FIG. 10 is a timing diagram illustrating a method for generating an internal clock for the semiconductor memory device illustrated in FIGS. 5 through 9, in accordance with the present invention.

Referring to FIG. 10, the internal clock INT_CLK in the normal mode is generated by buffering the external clock CLK, and the internal clock INT_CLK in the high-speed test mode is generated by performing an XOR operation of the external clock CLK and the 90°-delayed external clock CLKB. When compared to the internal clock INT_CLK in the normal mode, the internal clock INT_CLK in the high-speed test mode has an XOR delay, that is, a delay due to the XOR operation.

Since the delay-locked loop generating the data clock compensates for the delay generated at the generation of the doubled clock, the output data DOUT in the high-speed test mode is output in synchronization with the external clock CLK. Furthermore, since the internal clock INT_CLK is generated using the doubled clock synchronized with the external clock CLK in the high-speed test mode, the internal clock INT_CLK in the normal mode and the internal clock INT_CLK in the high-speed test mode are synchronized with each other. Consequently, the internal clock INT_CLK in the high-speed test mode has a rising edge at the time when the internal clock INT_CLK in the normal mode has a rising edge. Accordingly, a process variation (PVT variation) corresponding to the XOR delay is reduced to obtain the valid data window tDV of the output data DOUT. Also, since the margin between the data clock CLKDQ and the internal clock INT_CLK in the high-speed test mode may be readily obtained, it is possible to obtain a suitable frequency margin of the semiconductor memory device.

As described above, the present invention makes it possible to generate the internal clock with the same timing as the internal clock in the normal mode even in the high-speed test mode, and to generate the data clock such that the data is output in synchronization with the external clock. Accordingly, it is possible to obtain the margin between the internal clock and the data clock in the high-speed test mode, and to enhance the correlation between the normal mode and the high-speed test mode of the semiconductor memory device. Consequently, it is possible to efficiently perform a high-speed test operation on the semiconductor memory device.

While the present invention has been described with reference to the example embodiments, it will be apparent to those skilled in the art that various changes and modifications may be made without departing from the spirit and scope of the invention as defined in the following claims.

What is claimed is:

1. A method of generating an internal clock for a semiconductor memory device, the method comprising:
   generating a doubled clock during operation in a high-speed test mode in response to an external clock;
   generating a data clock by delaying the doubled clock so that data read from a memory cell array in the semiconductor memory device is output in synchronization with the external clock;
   generating a doubled sync clock synchronized with the external clock by delaying the data clock; and
   generating the internal clock during operation in the high-speed test mode by delaying the doubled sync clock by a delay amount that corresponds to a delay amount experienced in generation of the internal clock in response to the external clock during operation in a normal mode.

2. The method of claim 1, wherein generating the data clock includes:
   compensating for a delay occurring during the generation of the doubled clock at a delay-locked loop so that the data clock causes the read data to be output in synchronization with the external clock.

3. The method of claim 2, wherein the delay-locked loop adjusts a delay of a variable delay line in response to a phase difference between the doubled clock and the doubled sync clock, the variable delay line being included in the delay-locked loop.

4. The method of claim 3, wherein the doubled clock is generated by performing an XOR operation of the external clock and a 90°-delayed external clock.

5. A semiconductor memory device comprising:
   a clock doubler configured to generate a doubled clock during operation in a high-speed test mode in response to an external clock;
   a delay-locked loop configured to generate a data clock in response to the doubled clock so that data read from a memory cell array in the semiconductor memory device is output in synchronization with the external clock, and configured to generate a doubled sync clock synchronized with the external clock by delaying the data clock;
   a clock buffer configured to generate an internal clock during operation in the high-speed test mode by delaying the doubled sync clock by a delay amount that corresponds to a delay amount experienced in generation of the internal clock in response to the external clock during operation in a normal mode; and
   an internal circuit configured to read the data from the memory cell array in response to the internal clock.

6. The semiconductor memory device of claim 5, wherein the clock doubler comprises an XOR gate.

7. The semiconductor memory device of claim 5, wherein the delay-locked loop includes:
   a variable delay line configured to delay the doubled clock in response to a delay control signal;
   a delay compensator configured to compensate an output signal of the variable delay line for a delay time of the variable delay line;
   a doubling compensator configured to compensate an output signal of the delay compensator for a delay time of the clock doubler;
   a phase detector configured to detect a phase difference between the doubled clock and an output signal of the doubling compensator; and
   a low-pass filter configured to filter an output signal of the phase detector to generate the delay control signal.

8. The semiconductor memory device of claim 7, wherein the data clock is generated by buffering the output signal of the variable delay line.

9. The semiconductor memory device of claim 5, wherein the clock buffer generates a test control clock having substantially the same frequency as the external clock during operation in the high-speed test mode.

10. The semiconductor memory device of claim 9, wherein the internal circuit includes:
    a peripheral circuit configured to read the data from the memory cell array and output the read data in response to the internal clock; and
    a test mode circuit configured to control a test mode of the peripheral circuit by generating a test mode signal in response to an external test command and the test control clock.

11. A semiconductor memory device comprising:
    a clock doubler configured to generate a doubled clock during operation in a high-speed test mode by using an external clock;
    a delay-locked loop configured to generate a data clock for outputting data that is read from a memory cell array in response to the doubled clock;
    a clock buffer configured to generate an internal clock having double the frequency of the external clock and a test control clock having substantially the same frequency as the external clock during operation in the high-speed test mode; and
    an internal circuit configured to control a test mode of the semiconductor memory device in response to the test control clock, and configured to output the data that is read from the memory cell array in response to the internal clock.

12. The semiconductor memory device of claim 11, wherein the clock doubler comprises an XOR gate.

13. The semiconductor memory device of claim 11, wherein the delay-locked loop includes:
   a variable delay line configured to delay the doubled clock in response to a delay control signal;
   a delay compensator configured to compensate an output signal of the variable delay line for a delay time of the variable delay line;
   a doubling compensator configured to compensate an output signal of the delay compensator for a delay time of the XOR gate;
   a phase detector configured to detect a phase difference between the doubled clock and an output signal of the doubling compensator; and
   a low-pass filter configured to filter an output signal of the phase detector to generate the delay control signal.

14. The semiconductor memory device of claim 13, wherein the data clock is generated by buffering the output signal of the variable delay line.

* * * * *